United States Patent
Nathan

(10) Patent No.: US 6,903,458 B1
(45) Date of Patent: Jun. 7, 2005

(54) EMBEDDED CARRIER FOR AN INTEGRATED CIRCUIT CHIP

(76) Inventor: Richard J. Nathan, 1120 Deana Ct., Morgan Hill, CA (US) 95037

( * ) Notice: Subject to any disclaimer, the term of this patent is extended or adjusted under 35 U.S.C. 154(b) by 14 days.

(21) Appl. No.: 10/177,841

(22) Filed: Jun. 20, 2002

(51) Int. Cl.$^7$ .......................... H01L 23/488; H05K 7/02
(52) U.S. Cl. ........................ 257/737; 257/772; 257/777; 257/778; 361/783
(58) Field of Search .................. 257/702, 737, 257/772, 777, 778, 787; 438/108, 613; 361/768, 783

(56) References Cited

U.S. PATENT DOCUMENTS

| | | | |
|---|---|---|---|
| 4,722,914 A | 2/1988 | Drye et al. | 438/107 |
| 4,835,598 A | 5/1989 | Higuchi et al. | 357/72 |
| 4,918,811 A | 4/1990 | Eichelberger et al. | 438/107 |
| 5,032,896 A | 7/1991 | Little et al. | 257/686 |
| 5,063,177 A | 11/1991 | Geller et al. | 438/107 |
| 5,188,984 A | 2/1993 | Nishiguchi | 438/107 |
| 5,313,366 A * | 5/1994 | Gaudenzi et al. | 361/760 |
| 5,353,498 A | 10/1994 | Fillion et al. | 29/840 |
| 5,375,041 A | 12/1994 | McMahon | 361/749 |
| 5,406,116 A | 4/1995 | Wills et al. | 257/630 |
| 5,488,257 A | 1/1996 | Bhattacharyya et al. | 257/774 |
| 5,545,291 A | 8/1996 | Smith et al. | 438/107 |
| 5,556,807 A | 9/1996 | Bhattacharyya et al. | 437/209 |
| 5,608,262 A * | 3/1997 | Degani et al. | 257/723 |
| 5,629,835 A | 5/1997 | Mahulikar et al. | 361/719 |
| 5,701,233 A | 12/1997 | Carson et al. | 361/735 |
| 5,745,984 A | 5/1998 | Cole, Jr. et al. | 29/834 |
| 5,756,368 A | 5/1998 | Peterson et al. | 438/110 |
| 5,776,800 A | 7/1998 | Hamburgen et al. | 438/122 |
| 5,783,856 A | 7/1998 | Smith et al. | 257/618 |
| 5,815,372 A | 9/1998 | Gallas | 361/760 |
| 5,821,762 A | 10/1998 | Hamaguchi et al. | 324/754 |
| 5,880,529 A | 3/1999 | Barrow | 257/782 |
| 5,949,133 A | 9/1999 | Wojnarowski | 257/668 |
| 5,963,429 A | 10/1999 | Chen | 361/764 |
| 5,976,980 A | 11/1999 | Livengood et al. | 438/691 |
| 5,982,632 A | 11/1999 | Mosley et al. | 361/775 |
| 5,998,868 A | 12/1999 | Pogge et al. | 257/730 |
| 6,013,948 A | 1/2000 | Akram et al. | 257/698 |
| 6,038,133 A | 3/2000 | Nakatani et al. | 361/760 |
| 6,075,427 A * | 6/2000 | Tai et al. | 333/219 |
| 6,075,711 A | 6/2000 | Brown et al. | 361/761 |
| 6,130,478 A | 10/2000 | Dumoulin et al. | 257/728 |
| 6,147,876 A * | 11/2000 | Yamaguchi et al. | 361/766 |
| 6,162,652 A | 12/2000 | Dass et al. | 438/18 |
| 6,175,161 B1 | 1/2001 | Goetz et al. | 257/780 |

(Continued)

OTHER PUBLICATIONS

Mahajan, Ravi et al., "Emerging Directions For Packaging Technologics", Intel Technology Journal, vol. 6, Issue 2, Published, May 16, 2002, ISSN 1535766X, Cover page plus pp. 62–75.

(Continued)

Primary Examiner—Carl Whitehead, Jr.
Assistant Examiner—Stephen W. Smoot

(57) ABSTRACT

A carrier for an integrated chip is embedded into a substrate, so that stresses due to thermal expansion are uniformly distributed over an interface between the substrate and the carrier (hereinafter "embedded carrier"). Such an embedded carrier may be formed of a material having a coefficient of thermal expansion similar or identical to the coefficient of thermal expansion of an integrated circuit chip to be mounted thereon, so as to eliminate stresses (due to thermal expansion) at joints between the carrier and the integrated circuit chip. The just-described joints may be formed by any method well known in the art, e.g. flip-chip bonding. Such packaging of one or more integrated circuit chip(s) eliminates reliability issues associated with conventional flip chip bonded components, which are caused by, for example, concentration of stresses in conventional solder ball interconnections between a chip and a substrate.

60 Claims, 16 Drawing Sheets

U.S. PATENT DOCUMENTS

| | | | |
|---|---|---|---|
| 6,204,095 B1 | 3/2001 | Franworth | 438/127 |
| 6,229,216 B1 | 5/2001 | Ma et al. | 257/777 |
| 6,239,496 B1 | 5/2001 | Asada | 257/777 |
| 6,307,450 B2 | 10/2001 | Takahashi et al. | 333/204 |
| 6,309,912 B1 | 10/2001 | Chiou et al. | 438/118 |
| 6,316,278 B1 | 11/2001 | Jacobsen et al. | 438/22 |
| 6,333,210 B1 * | 12/2001 | Dubey et al. | 438/108 |
| 6,338,767 B1 | 1/2002 | Nakatani et al. | 156/233 |
| 6,528,351 B1 | 3/2003 | Nathan et al. | 438/118 |

OTHER PUBLICATIONS

Press Release, Oct. 8, 2001, Santa Clara, CA, "Intel Researchers Disclose Packaging Technology Breakthrough to Enable Billion-Transistor Processors", 2 pages. http://www.intel.com/pressroom/archive/releases/20011008tech.htm.

Press Release, Oct. 8, 2001, Santa Clara, CA, "Bumpless Build-up Layer Packaging Technologies", 3 pages, http://www.intel.com/pressroom/archive/backgrnd/20011008tech_bkgrd.htm.

U.S. patent application Ser. No. 10/098,021, Nathan, filed Mar. 12, 2002.

U.S. patent application Ser. No. 09/953,005, Nathan, filed Sep. 13, 2001.

U.S. patent application Ser. No. 10/097,363, Nathan, filed Mar. 12, 2002.

U.S. patent application Ser. No. 10/077,211, Nathan, filed Feb. 14, 2002.

* cited by examiner

EMBEDDED CARRIER FOR AN INTEGRATED CIRCUIT CHIP

CROSS-REFERENCE TO RELATED APPLICATIONS

This invention relates to the following applications all of which have Richard J. Nathan as a common inventor:

(1) application Ser. No. 09/953,005, filed Sep. 13, 2001, entitled "Integrated Assembly Protocol";

(2) application Ser. No. 09/963,337, filed Sep. 24, 2001, entitled "Integrated Package and Methods of Making Same" now issued as U.S. Pat. No. 6,528,351; and (3) application Ser. No. 10/077,211 entitled "Integrated Circuit Package and Method for Fabrication", filed Feb. 14, 2002.

All these three patent applications are incorporated herein by reference in their entirety.

DISCUSSION OF RELATED ART

U.S. Pat. No. 6,175,161 granted to Goetz, et al. on Jan. 16, 2001 (that is incorporated by reference herein in its entirety) discloses a system and method for packaging integrated circuits. Specifically, the system and method interconnect a plurality of ICs, thereby improving the electrical performance of the overall system while reducing contact degradation due to stress that results from differences in the coefficients of thermal expansion of the various components during thermal cycling.

U.S. Pat. No. 6,075,711 granted to Brown, et al. on Jun. 13, 2000 (that is also incorporated by reference herein in its entirety) discloses a system and method for routing connections of integrated circuits. Specifically, a plurality of carriers corresponds to a plurality of ICs, and a board has a plurality of board regions for receiving the plurality of ICs. In one embodiment, a carrier is provided for each IC in a complex IC. A board having openings is provided, and the ICs are fitted into the board openings with the carriers mounted thereto.

SUMMARY

In accordance with the invention, a carrier for an integrated chip is embedded into a substrate, so that stresses due to thermal expansion are uniformly distributed over an interface between the substrate and the carrier (hereinafter "embedded carrier"). Such an embedded carrier may be formed of a material having a coefficient of thermal expansion similar or identical to the coefficient of thermal expansion of the integrated circuit chip, so as to eliminate or minimize stresses (due to thermal expansion) at joints between the carrier and the integrated circuit chip. The just-described joints may be formed by any method well known in the art, e.g. flip-chip bonding.

Such an electronic component eliminates reliability issues associated with conventional flip chip bonded components, which are caused by, for example, concentration of stresses in conventional solder ball interconnections between a chip and a substrate. Underfill, if used in accordance with the invention, does not need to be stiff enough to distribute mechanical forces due to stress, and instead may be provided primarily for protection of the above-described joints and device surfaces.

In certain embodiments, the embedded carrier has pads (e.g. at its periphery) that are electrically coupled to pads on the substrate by traces of conductive material therebetween. Alternatively, the embedded carrier may have through-hole connections (also called "vias") that electrically couple circuitry on the substrate to circuitry on the external structure, in which case the embedded carrier has a conductive surface on each side thereof.

In several embodiments, the embedded carrier contains circuitry for routing of signals between the integrated circuit chip and the substrate. Depending on the embodiment, the embedded carrier may also contain passive devices (such as resistors and/or capacitors) and/or active devices (such as, but not limited to, power transistors, logic gates and/or memory, analog circuits, surge or ESD protection circuitry).

DETAILED DESCRIPTION

In accordance with the invention, a carrier 100 (FIG. 1A) for an integrated circuit chip has two types of conductive terminals, namely pads A1–AN (wherein $1 \leq I \leq N$, N being the total number of pads) and lands L1–LN that are equal in number (i.e. N). Pads A1–AN are normally circular and of a size sufficient for connection to corresponding pads on the integrated circuit chip, e.g. to receive solder balls used in flip chip bonding. Depending on the embodiment, pads A1–AN, lands L1–LN and traces C1–CN may be made of copper, aluminum or other conductive material. In certain embodiments, pads A1–AN are plated on an upper surface thereof with a material required by flip chip bonding, such as nickel followed by gold. Lands L1–LN are used for electrical connection of the carrier to a substrate. Depending on the embodiment, lands L1–LN may be left unplated, although in some embodiments they are plated with nickel and gold, for example, to ensure non-oxidized metal contacts. In some embodiments, when aluminum is used to form pads A1–AN, lands L1–LN and traces C1–CN, nickel and gold may not be required.

Figure 1A:
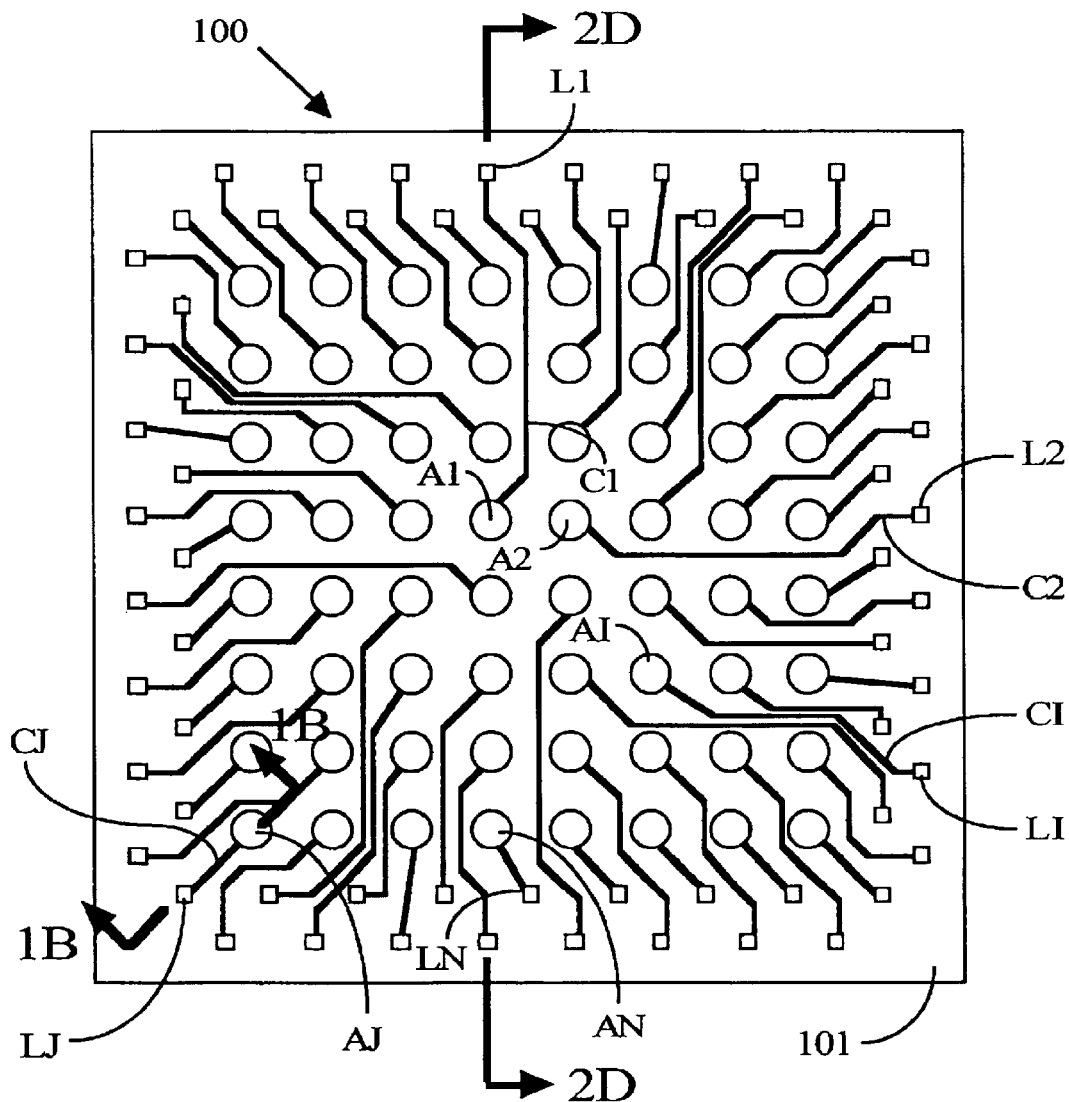
FIG. 1A illustrates, in a top plan view, a carrier that is to be embedded in a substrate in one embodiment of the invention.
Figure 8A:
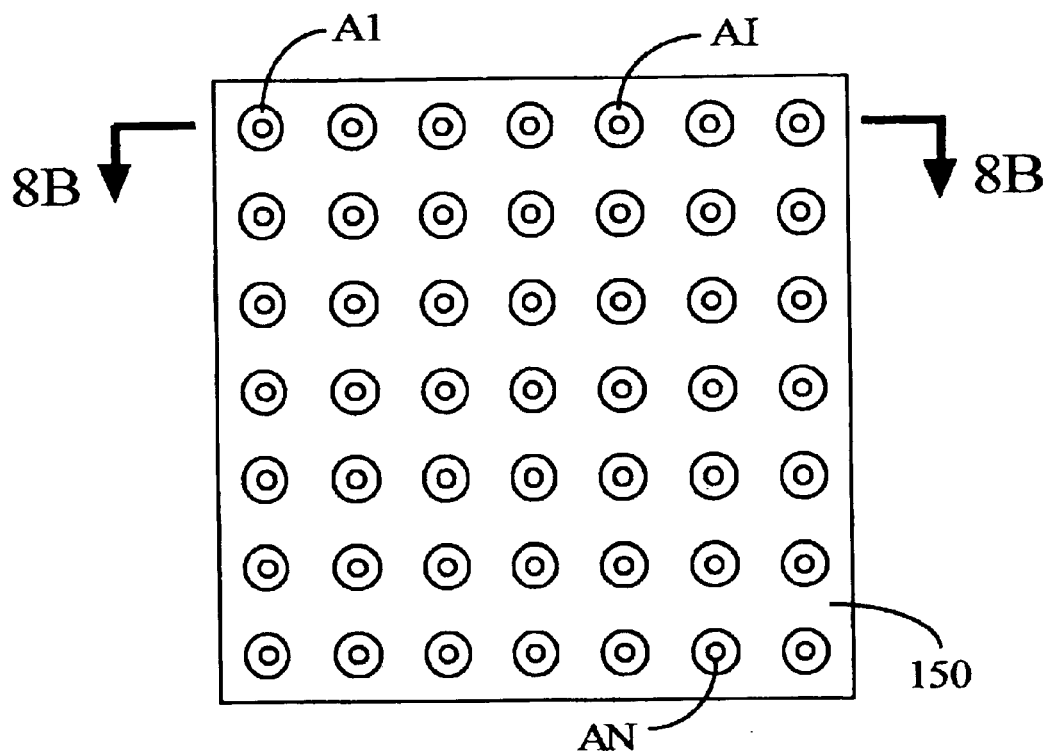
FIGS. 8A, 8B and 8C illustrate, in a plan view, a cross-sectional view, and an enlarged cross-sectional view respectively, a carrier of the type illustrated in FIGS. 2A and 2B, having through hole vias.
Figure 8B:
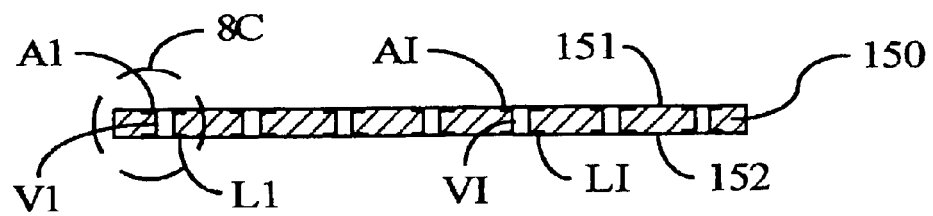

In the embodiment illustrated in FIG. 1A, both sets of terminals, namely pads A1–AN and lands L1–LN are formed on a top surface 101 of carrier 100 (see FIG. 1B), although in an alternative embodiment such terminals may be formed on a bottom surface 102, as described below in reference to FIGS. 8A–8C. When both sets of terminals are present on the same top surface 101 of carrier 100 as illustrated in FIG. 1A, a trace CI of conductive material electrically connects each pad AI to a corresponding land LI, so as to route signals between terminals A1–AN and terminals L1–LN.

Carrier 100 may be formed of any material (for example, ceramic, silicon, germanium or gallium arsenide) preferably but not necessarily having a coefficient of thermal expansion close to (e.g. within 50% of) the coefficient of thermal expansion of an integrated circuit chip to be mounted thereon. In certain embodiments, carrier 100 is an integrated circuit chip formed of silicon, by use of processes well known in the art such as metallization, photolithographic processes, and dielectric layer processes. In certain other embodiments, carrier 100 is formed of a ceramic material, while in still other embodiments carrier 100 is formed of a metal or an alloy.

When carrier 100 has a coefficient of thermal expansion between the coefficient of thermal expansion of substrate 210 and of integrated chip 310, then the stresses due to thermal expansion are spread across the entire structure instead of being primarily located at the interface between integrated circuit chip 310 and substrate 210 as would be the case in certain prior art structures. For this reason, although a specific percentage, such as 50% has been discussed above, any other percentage may be used (e.g. up to 100% of the coefficient of thermal expansion of integrated circuit chip 310).

In certain embodiments, trace CI may be formed by photolithography of the same conductive layer of which terminals A1–AN and L1–LN are formed (e.g. during semiconductor wafer processing). Thereafter, a passivation layer P is formed over the entire top surface 101 of carrier 100 (FIG. 1B), in the normal manner, with pads A1–AN and lands L1–LN exposed to enable connection to integrated circuit chip(s) and a substrate respectively. In certain embodiments, a photoimagible polymer (e.g. polyamide) may be blanket deposited over the entire carrier 100, and thereafter exposed and developed to expose lands L1–LN and pads A1–AN. In other embodiments, a glass like material such as SiO2 (glass) or Si3N4 (silicon nitride) may be blanket deposited (by chemical vapor deposition) over the entire carrier 100, and coated with a photo resist to define, etch and expose lands L1–LN and pads A1–AN.

In some embodiments, carrier 100 is formed using semiconductor processing techniques of photo masking and metallization. Carrier 100 is therefore just one chip of many formed on a wafer. For example, a small chip like this one would have over 2000 units on a 6 inch wafer. Larger chips would be under 100 (even under 50).

In addition to traces C1–CN, depending on the embodiment, carrier 100 may also contain passive devices (such as, but not limited to, resistors and/or capacitors) and/or active devices (such as, but not limited to, power transistors, logic gates and/or memory). In certain applications, active and passive circuitry included in carrier 100 provides circuit protection for one or more to-be-mounted integrated circuit chip(s), from electro-static discharge (ESD) or other over-voltage occurrences, as well as providing protection from current surges.

Figure 1B:
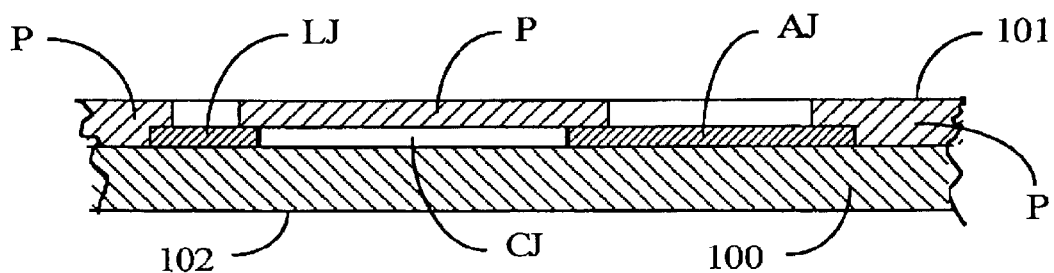
FIG. 1B illustrates, in a cross-sectional view along the direction 1B—1B in FIG. 1A, a portion of the carrier of FIG. 1A

Note that FIGS. 1A and 1B are merely illustrative and it will be understood by the skilled person that the number of pads and/or lands may be different, e.g. if there are one or more rings on carrier 100, that are meant to carry a potential of Vcc and/or the ground reference potential of 0 volt, and/or buried conductive planes that are meant to carry ground and Vcc potentials.

In accordance with the invention, carrier 100 is embedded in a substrate 210 (FIG. 2A) thereby to form a monolithic integrated structure 200. In some embodiments, the thickness Ts of substrate 210 may be two or more times greater than the thickness Tc of carrier 100, although in other embodiments these two thicknesses may be substantially the same (e.g. as illustrated in FIGS. 8A–8C). Note that the area covered by carrier 100 is smaller than the area of substrate 210, although larger than the area of one or more to-be-mounted integrated circuit chips.

Embedding carrier 100 in a substrate 210 distributes stresses (that are normally generated by changes in temperature) uniformly over an interface between the structure and the substrate. Specifically, when the temperature rises, carrier 100 expands so that bottom surface 102 moves outward by a small distance (which is shown exaggagerated in FIG. 2C) to become surface 102E which in turn comes under stress from substrate 210 that resists the expansion. The stress is present over all of the area in which substrate 210 and carrier 100 contact one another, as illustrated by the arrows around surface 102E in FIG. 2C.

The just-described stresses typically arise in certain embodiments wherein substrate 210 is made of a material having a coefficient of thermal expansion different from the material of carrier 100. Substrate 210 is typically made of an organic material, e.g. a plastic (such as Bismalemide Triazene (BT) epoxy resin developed by Mitsubishi Gas Chemical) or FR4, and may include fibers selected from a group consisting of glass, fiber glass and aramid materials. Note however, that in some embodiments, substrate 210 is made of, for example, glass, ceramic or metal.

In some embodiments, monolithic integrated structure 200 (FIG. 2A) includes a number N of conductive traces B1–BN that provide electrical connections between the above-described lands L1–LN (not labeled in FIG. 2A) on carrier 100, and a corresponding number of lands K1–KN on substrate 210. In some embodiments, top surface 101 of carrier 100 is at least sufficiently coplanar with top surface 211 of substrate 210 so as to support the spanning of traces B1–BN therebetween. Such a monolithic integrated structure 200 may be formed in any manner described in the above-referenced patent applications.

Note that although bottom surface 102 of carrier 100 is shown to be not coplanar with bottom surface 212 of substrate 210 in FIG. 2B, in an alternative embodiment these two bottom surfaces are made coplanar, as described below in reference to FIGS. 8A–8C. Moreover, although top surface 101 of carrier 100 is illustrated as being substantially (or even completely) coplanar with top surface 211 of substrate 210, these two top surfaces need not be coplanar if interconnections therebetween do not require these two surfaces to be coplanar, e.g. if the respective bottom surfaces are made substantially coplanar and interconnections (similar to traces B1–BN) are formed thereon.

Figure 2A:
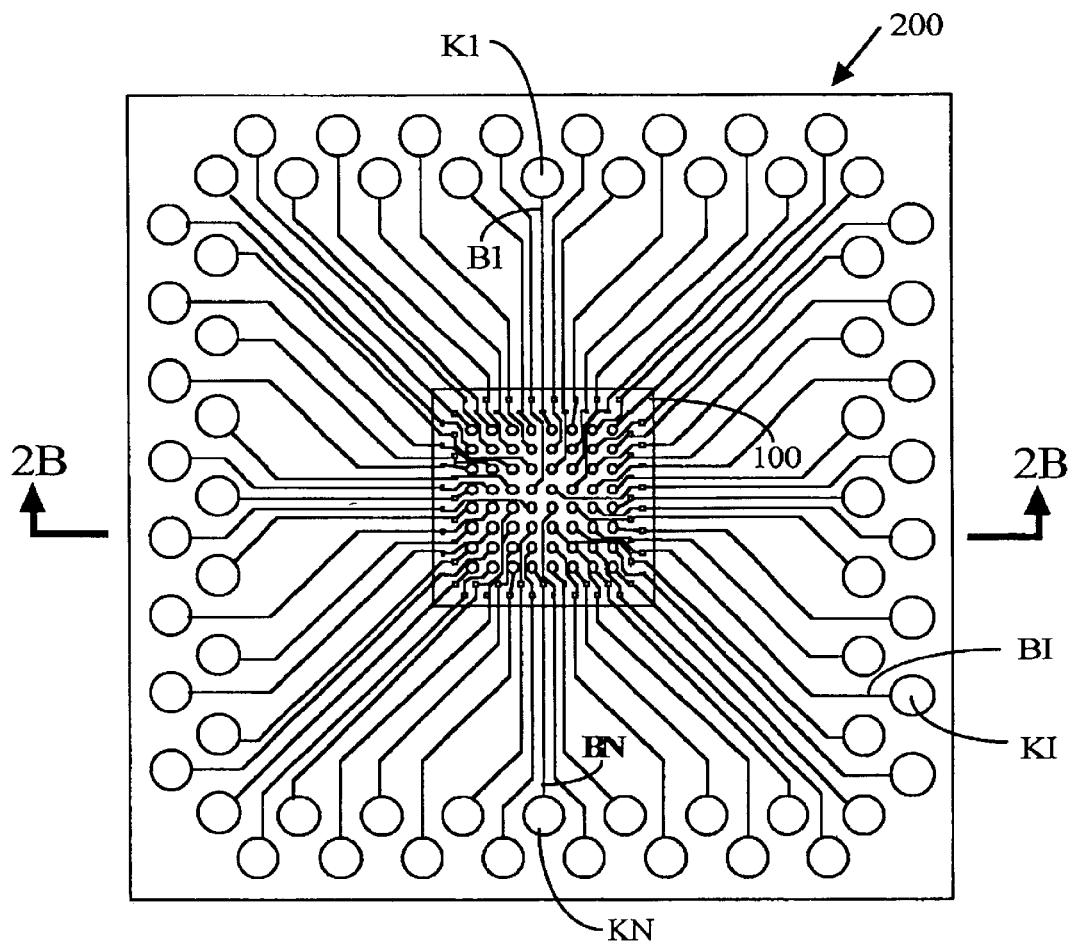
FIG. 2A illustrates, in a top plan view, the carrier of FIG. 1A embedded in a substrate, and conductive traces that connect lands on the carrier to lands on the substrate, to form a monolithic integrated structure.
Figure 2B:
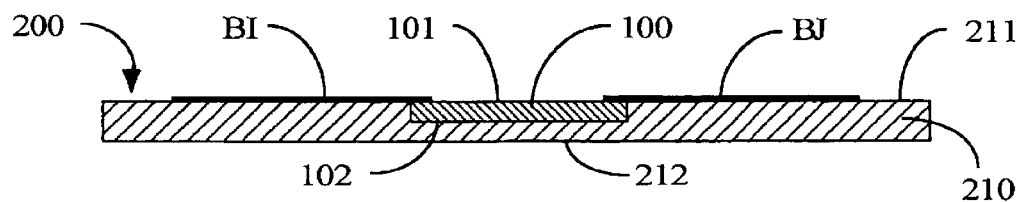
FIG. 2B illustrates, in a cross-sectional view, the monolithic integrated structure of FIG. 2A (in the direction 2B—2B in FIG. 2A).

Note that at the scales necessary to show substrate 210 in FIGS. 2A and 2B, details of carrier 100 become difficult to discern, which is why they are shown in detail in FIGS. 1A and 1B. Note also that although N=64 in FIGS. 1A, 1B, 2A and 2B, it would be apparent to the skilled artisan that any arbitrary number may be chosen. For example N can be 900 (as illustrated in the corner detail of a carrier shown in FIG. 10), resulting in a very big array, and in such an embodiment, the detail of carrier 100 becomes difficult to see, and difficult to be scaled to be seen at the same time as the substrate 210. Note that when the carrier has so many terminals, a number of routing layers are used to interconnect the pads to the lands, and for clarity such interconnections are not shown in FIGS. 10A–10D.

Figure 2C:
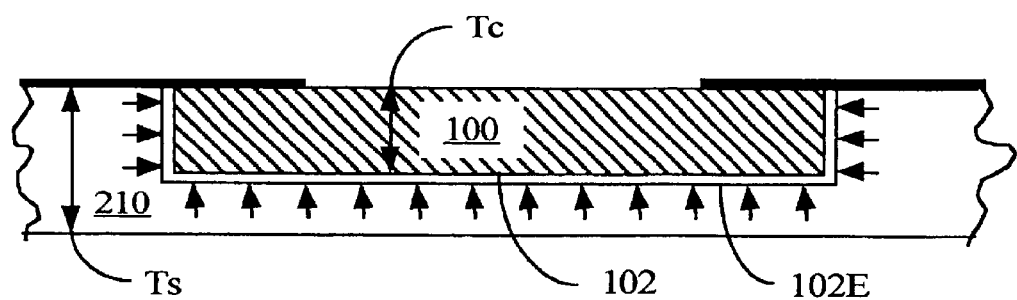
FIG. 2C illustrates, an enlargement of a portion of the cross-sectional view of FIG. 2B, to illustrate an interface between the substrate and the embedded carrier.
Figure 2D:
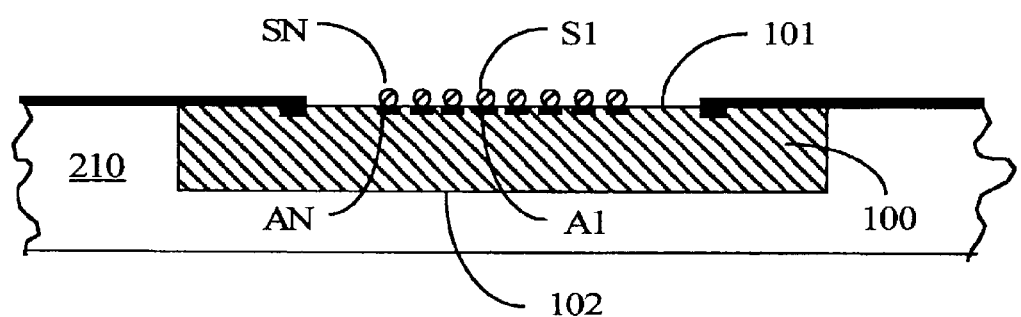
FIG. 2D illustrates, in an enlarged cross-sectional view, a portion of the monolithic integrated structure of FIG. 2A sectioned along the direction 2D—2D in FIG. 1A, and solder balls located on pads A1–AN for receiving an integrated circuit chip in one embodiment.

Although not shown in FIG. 2C, carrier 100 has a number of pads A1–AN that are located in a central region of top surface 101, as illustrated in FIGS. 1A and 2A. Specifically, in several embodiments, pads A1–AN of carrier 100 are arranged in a two dimensional array, although in some embodiments, certain locations in such a two dimensional array may be left unpopulated, depending on routing constraints. As noted above, in some embodiments, pads A1–AN in the center of carrier 100 receive solder balls attached to an integrated circuit chip, during flip chip bonding. In other embodiments, a number of solder balls S1–SN (FIG. 2D) are placed directly on these pads A1–AN of carrier 100, and subsequently integrated circuit chips with or without solder balls are attached to the solder balls S1–SN, by flip chip bonding.

Figure 3A:
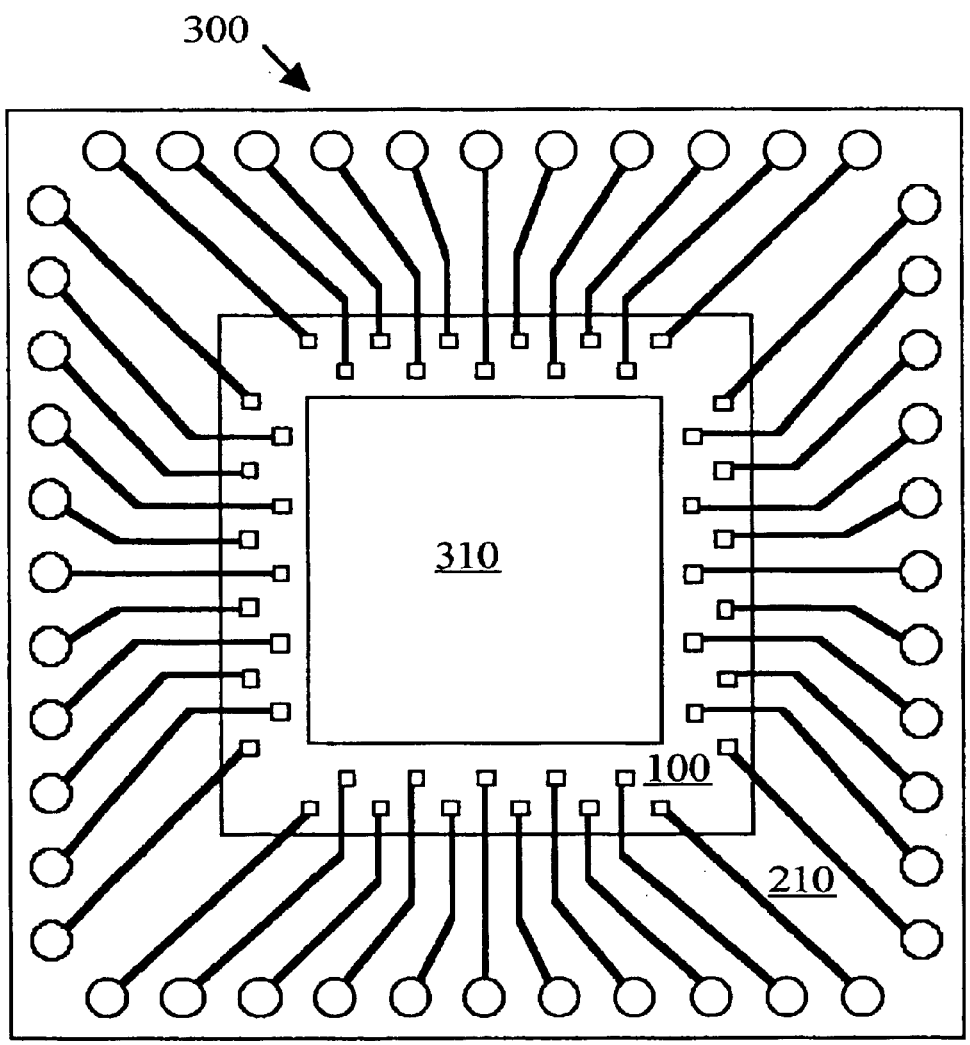
FIGS. 3A and 3B illustrate, in top plan and cross-sectional views, an embedded carrier of the type illustrated in FIGS. 2A and 2B, supporting an integrated circuit chip in an electronic component, in a die down configuration.
Figure 3B:
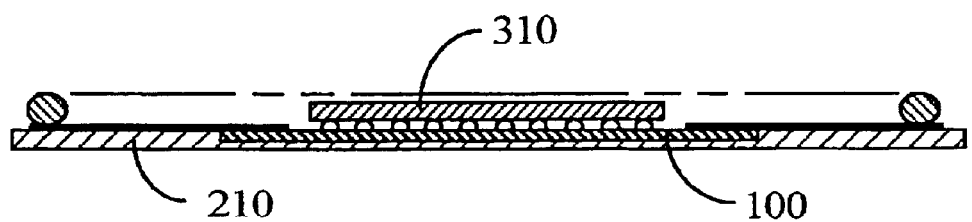

Regardless of either or both of carrier 100 and integrated circuit chip 310 having solder balls, eventually flip chip bonding of integrated circuit chip 310 (FIG. 3A) to carrier 100 results in an electronic component 300. In such an electronic component 300, stresses due to temperature changes are eliminated or minimized between carrier 100 and integrated circuit chip 310 in several embodiments if these two structures are made of materials having similar or identical thermal expansion properties. Therefore, in some embodiments, an electronic component 300 of the type described above eliminates reliability issues associated with conventional flip chip bonded components, which are caused by, for example, concentration of stresses in solder balls interconnections between a chip and a substrate.

Underfill, if used between electronic component 300 and carrier 100, does not need to be rigid enough to distribute the mechanical forces due to stress as may be required by the prior art. Instead, as noted below, underfill if used may protect the surface of component 300, although in some embodiments such underfill may distribute whatever minimal stress results from mechanical forces caused by thermal expansion therebetween.

Flip chip bonding of integrated circuit chip 310 to carrier 100 may be performed in any manner well known in the art. For example, a number of solder balls (also called "bumps") are placed on the pads of chip 310 after underbump metallization. Thereafter, solder is deposited by, for example, evaporation, electroplating, screen printing solder paste, or needle-depositing. After solder balls are formed on chip 310, chip 310 is placed on carrier 100 (that is embedded within substrate 210), with the solder balls on chip 310 contacting pads A1–AN. Next, the entire assembly is heated to make the solder reflow and form joints (and therefore electrical connections) between pads on chip 310 and pads A1–AN on carrier 100.

Any space between chip 310 and carrier 100 may be filled with a nonconductive "underfill" adhesive joining the entire surface of the chip to the carrier, in the normal manner. Note that the material used for underfill may be selected to protect the solder joints from moisture or other environmental hazards, but need not provide mechanical rigidity to the assembly. Specifically, the underfill may be flexible, and may not mechanically "lock together" the chip and the carrier as was done in some prior art processes.

Figure 4A:
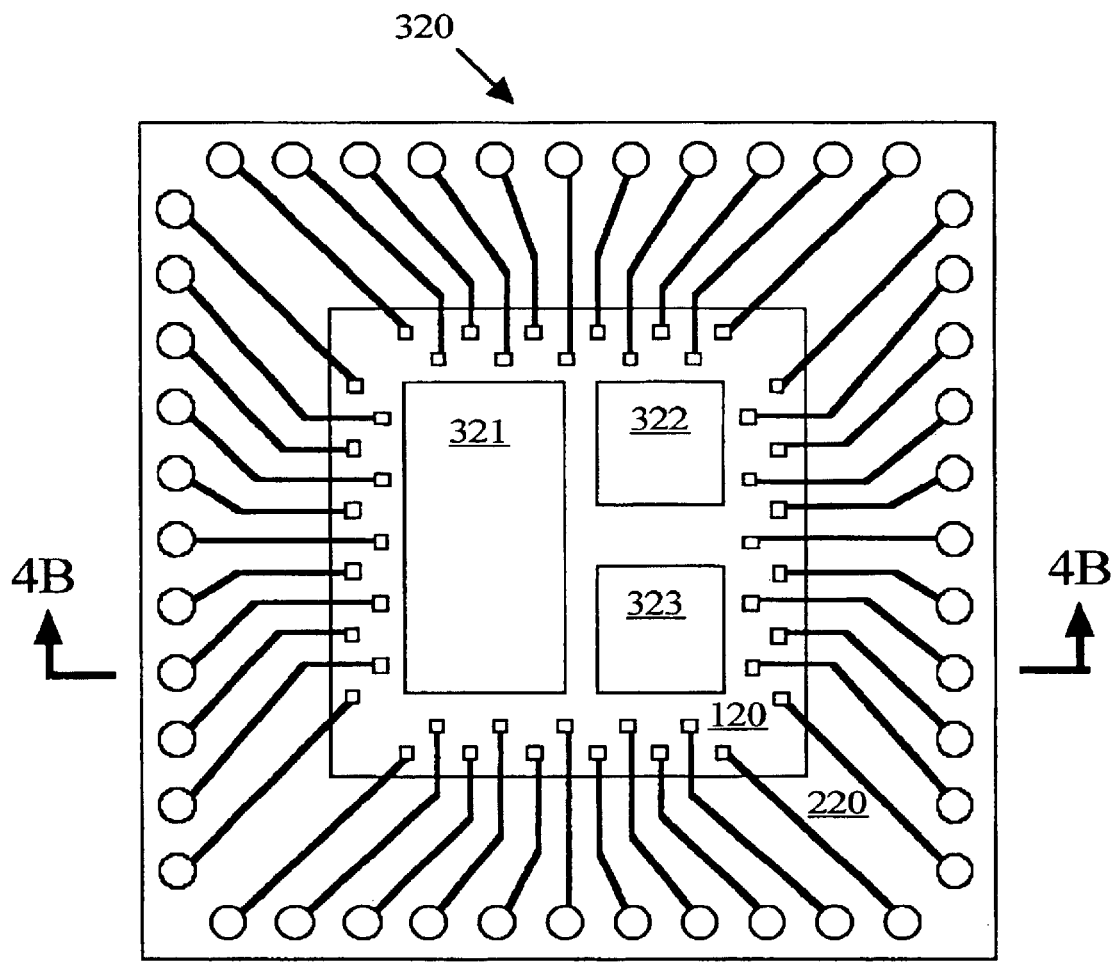
FIGS. 4A and 4B illustrate, in plan and cross-sectional views, an embedded carrier of the type illustrated in FIGS. 3A and 3B, supporting multiple integrated circuit chips in a multi-chip module (MCM), in a die down configuration.
Figure 4B:
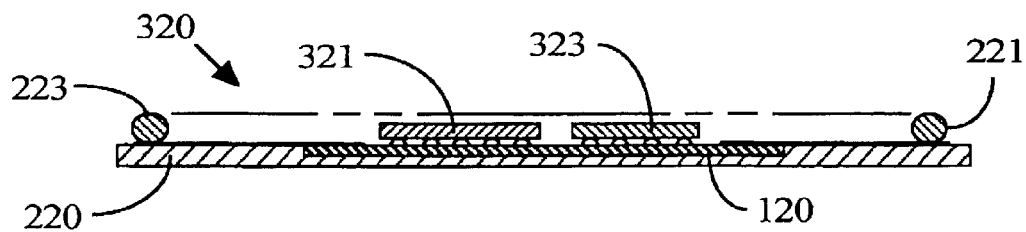

Although in reference to FIGS. 1A, 1B, 2A–2C, 3A and 3B only one integrated circuit chip has been described, it will be apparent to the skilled artisan that any number of integrated circuit chips may be included in an electronic component of the type described above. For example, FIGS. 4A and 4B illustrate a multi-chip module in which three integrated circuit chips 321–323 are supported on a carrier 120. Carrier 120 is similar to the above-described carrier 100 except for the location of pads to receive the solder balls on chips 321–323 and the location of traces for connection of these chips 321–323 to pads on a substrate 220. Note that although only three integrated circuit chips 321–323 are illustrated for convenience, any number of such chips may be included in multi-chip module, depending on the embodiment.

Figure 5A:
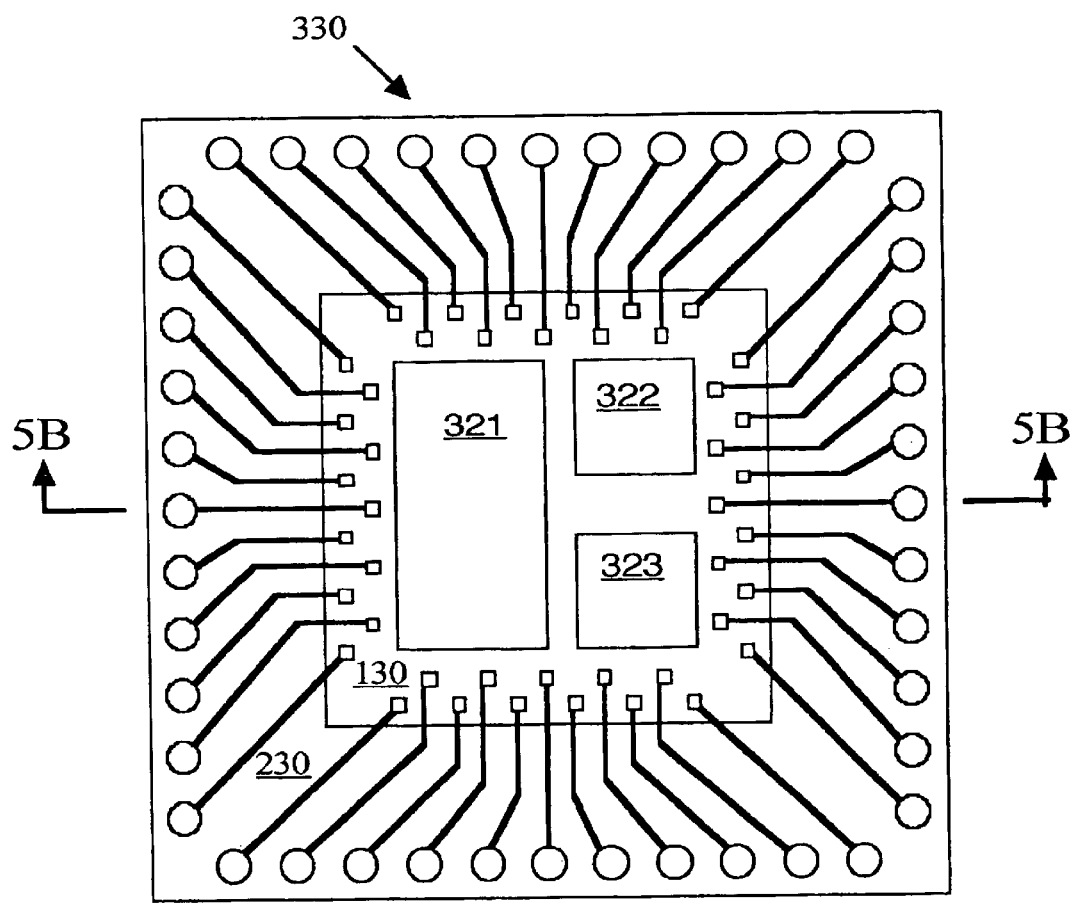
FIGS. 5A and 5B illustrate, in plan and cross-sectional views, an embedded carrier of the type illustrated in FIGS. 2A and 2B, supporting multiple integrated circuit chips in a multi-chip module (MCM), in a die up configuration.
Figure 5B:
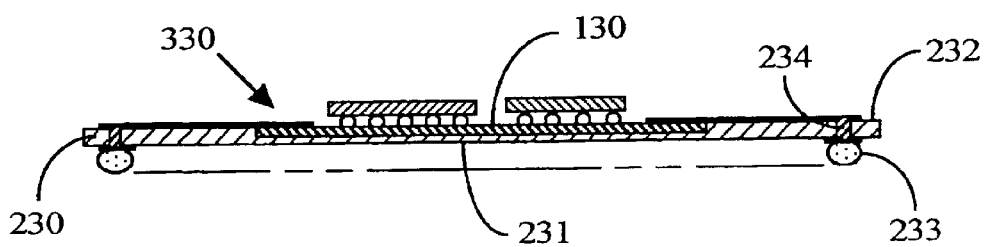

In the embodiment illustrated in FIGS. 4A–4B, substrate 220 has terminals and solder balls (e.g. solder ball 223) on a top surface 221 thereby to illustrate a die down configuration. In an alternative embodiment, such solder balls are formed on a bottom surface 231 (FIGS. 5A and 5B) of another substrate 230 that is similar to substrate 220, and such a solder ball may be connected to traces on top surface 232 by, for example, a through hole via 234, thereby to illustrate a die up configuration. As would be apparent to the skilled artisan, carriers 120 and 130 of FIGS. 4A, 4B, 5A and 5B may be designed to contain conductive traces to interconnect terminals of the various integrated circuit chips 321–323.

Figure 6A:
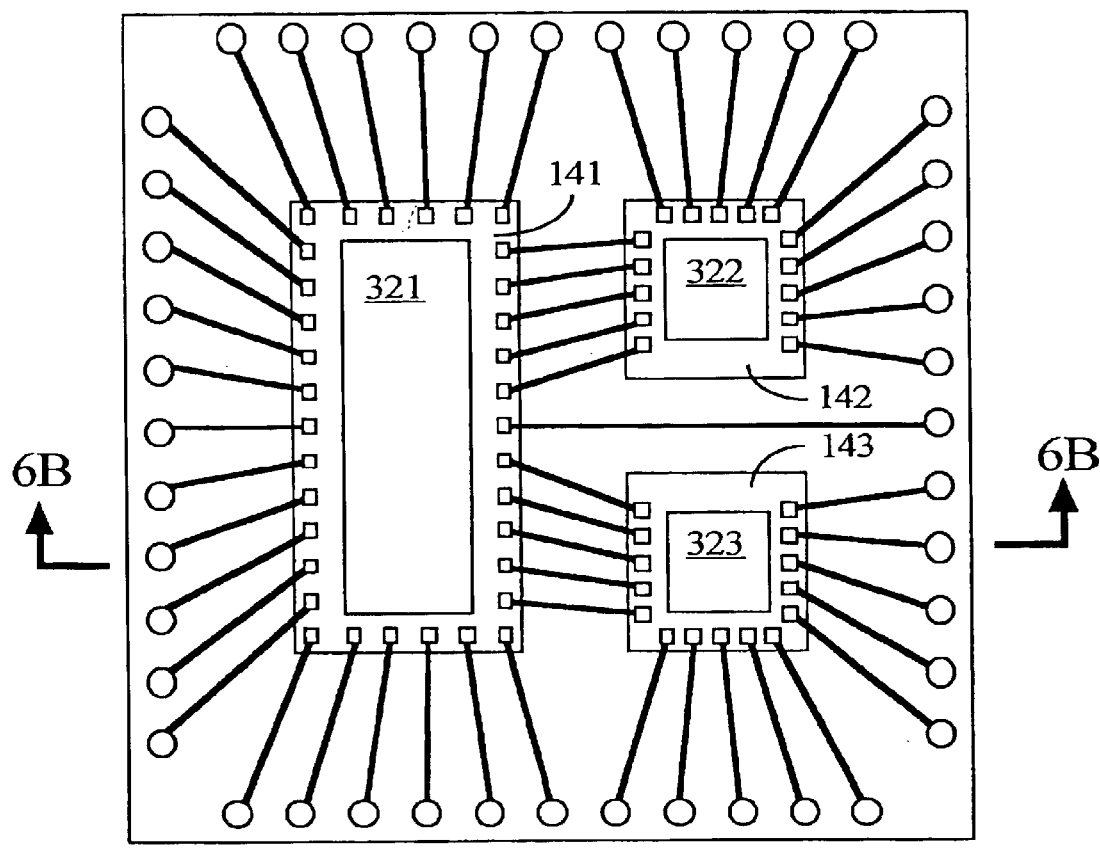
FIGS. 6A and 6B illustrate, in plan and cross-sectional views, multiple embedded carriers of the type illustrated in FIGS. 2A and 2B, each supporting one integrated circuit chip in a multi-chip module (MCM), in a die down configuration.
Figure 6B:
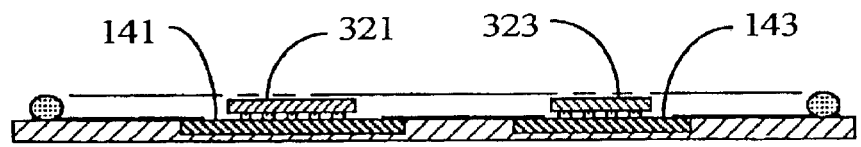
Figure 7A:
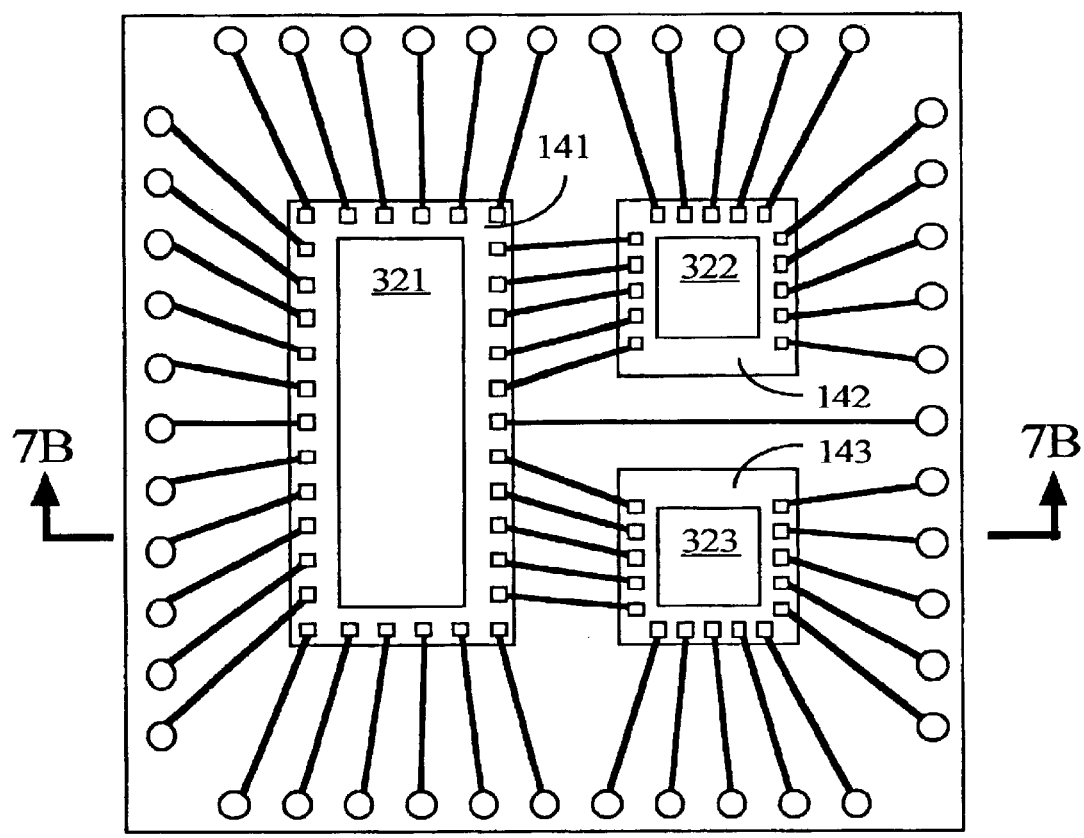
FIGS. 7A and 7B illustrate, in plan and cross-sectional views, multiple embedded carriers of the type illustrated in FIGS. 2A and 2B, each supporting one integrated circuit chip in a "multi-chip-module" (MCM), in a die up configuration.
Figure 7B:
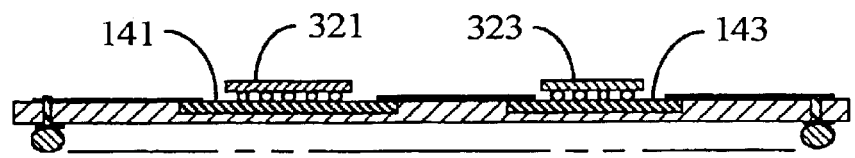

Furthermore, although in FIGS. 4A, 4B, 5A and 5B, a single carrier is illustrated as supporting three integrated circuit chips 321–323, in alternative embodiments each of chips 321–323 may be supported on its own carrier 141–143 as illustrated in FIGS. 6A, 6B in die down configuration and FIGS. 7A and 7B in die up configuration.

Moreover, a carrier 150 of the type described above can have a number of vias V1–VN that interconnect pads A1–AN formed on an upper surface 151 and lands L1–LN formed on a bottom surface 152. Carrier 150 can be formed in any manner well known in the art. For example, carrier 150 may be formed of a semiconductor or ceramic material and all conductive elements, namely terminals A1–AN, L1–LN and vias V1–VN may be formed by photolithographic processes well known in the art. Note that carrier 150 requires that a conductive layer be formed on both sides. In some embodiments, each of vias V1–VN are formed by first forming a via hole followed by forming a conductive wall (which may be cylindrical) in the via hole, or by filling the via hole with a conductive material. Such a conductive wall may be formed by a process called electroless plating, but a via hole could also be made conductive by sputtering a metal or alloy or filling the via hole with conductive material.

Figure 8C:

Moreover, in the embodiment illustrated in FIG. 8C, the via hole is closed off at the bottom surface 152, although this is not required in other embodiments. Note that lands L1–LN of some embodiments are located in the same exact location as the corresponding pads A1–AN.

Figure 8D:
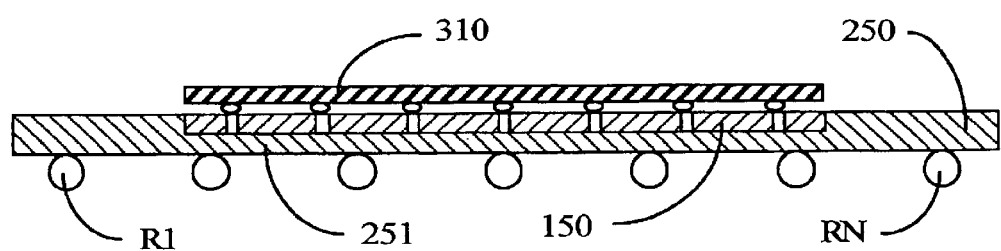
FIG. 8D illustrates, in a cross-sectional view, the carrier of FIGS. 8A–8C embedded in a substrate and supporting an integrated circuit chip, to form an electronic component of one embodiment.

Carrier 150 may be embedded in a substrate 250 (FIG. 8D). Substrate 250 of this embodiment has a conductive layer formed on an upper surface 251 of a cavity in contact with terminals L1–LN of carrier 150 that are connected through one or more routing layers (not shown) in the substrate to solder balls R1–RN. Such a conductive layer of substrate 250 may be formed after carrier 150 is placed into a cavity in substrate 250. For a complete description of how these connections are made, see the description of FIGS. 6a through 6c, in the related U.S. patent application Ser. No. 09/963,337 now U.S. Pat. No. 6,528,351 that has been incorporated by reference above. In this embodiment, the just-described cavity may be formed ahead of time in substrate 250 (i.e. or formed simultaneously in an embedding process wherein carrier 150 is pushed into a softened substrate 250). As noted above, the top surfaces of carrier 150 and substrate 250 need not be coplanar. In this embodiment as well, an integrated circuit chip 310 may be flip chip bonded to carrier 150, in the manner described above.

Figure 9A:
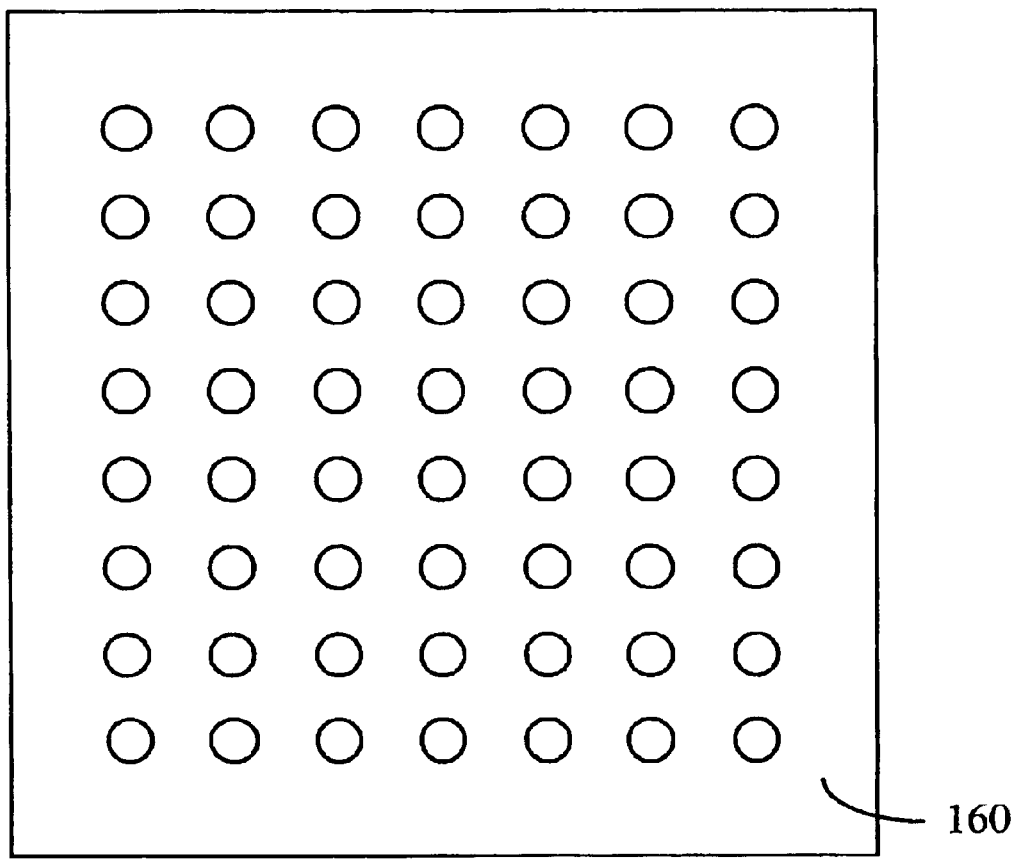
FIGS. 9A and 9B illustrate, in top plan and cross-sectional views, an embedded carrier of the type illustrated in FIGS. 8A–8C having multiple layers of conductive traces coupled by vias.
Figure 9B:
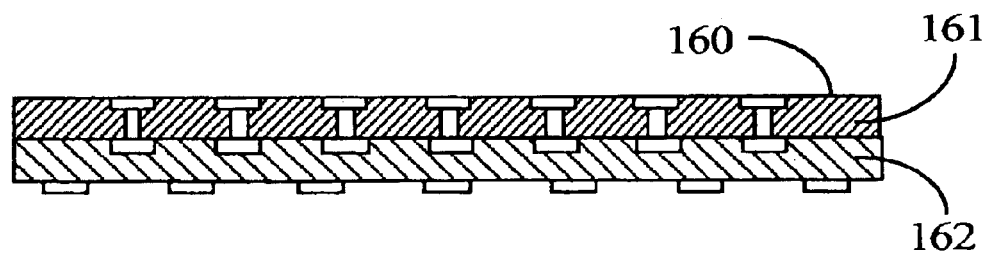
Figure 9C:
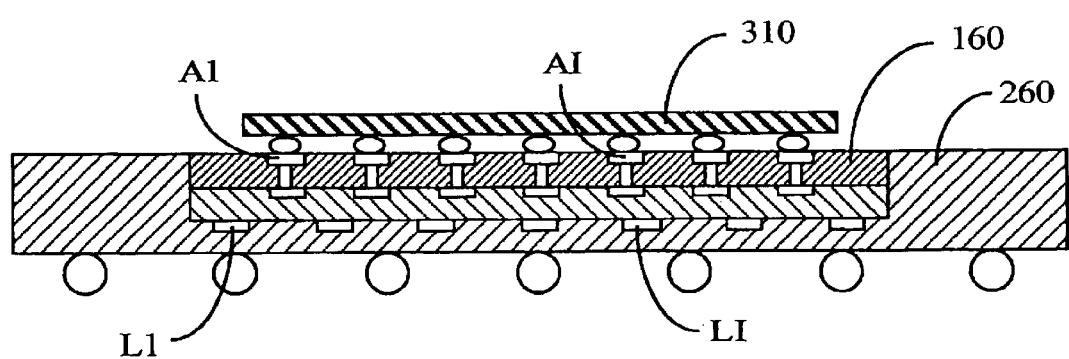
FIGS. 9C and 9D illustrate, in cross-sectional and top plan views, the embedded carrier of FIGS. 9A and 9B supporting an integrated circuit chip in an electronic component, in a die up configuration.
Figure 9D:
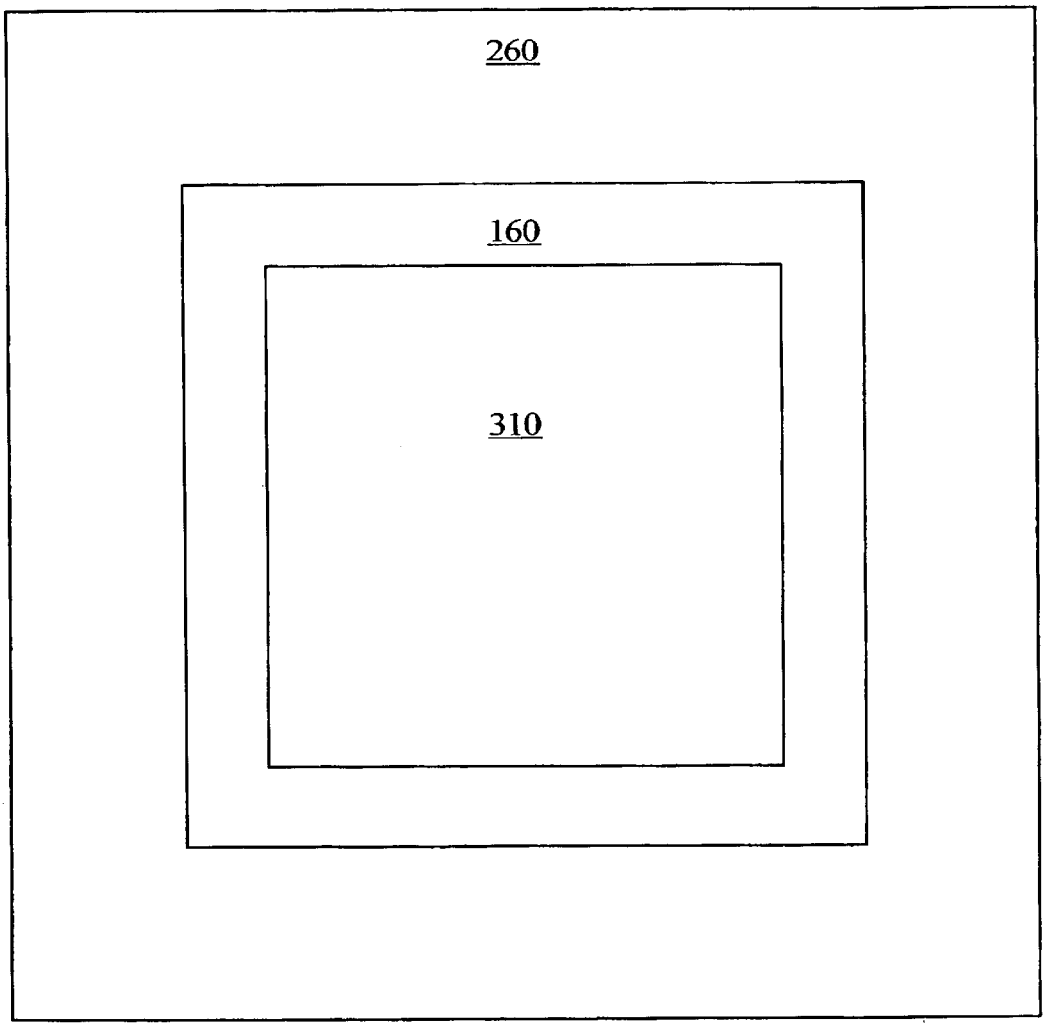
Figure 10A:
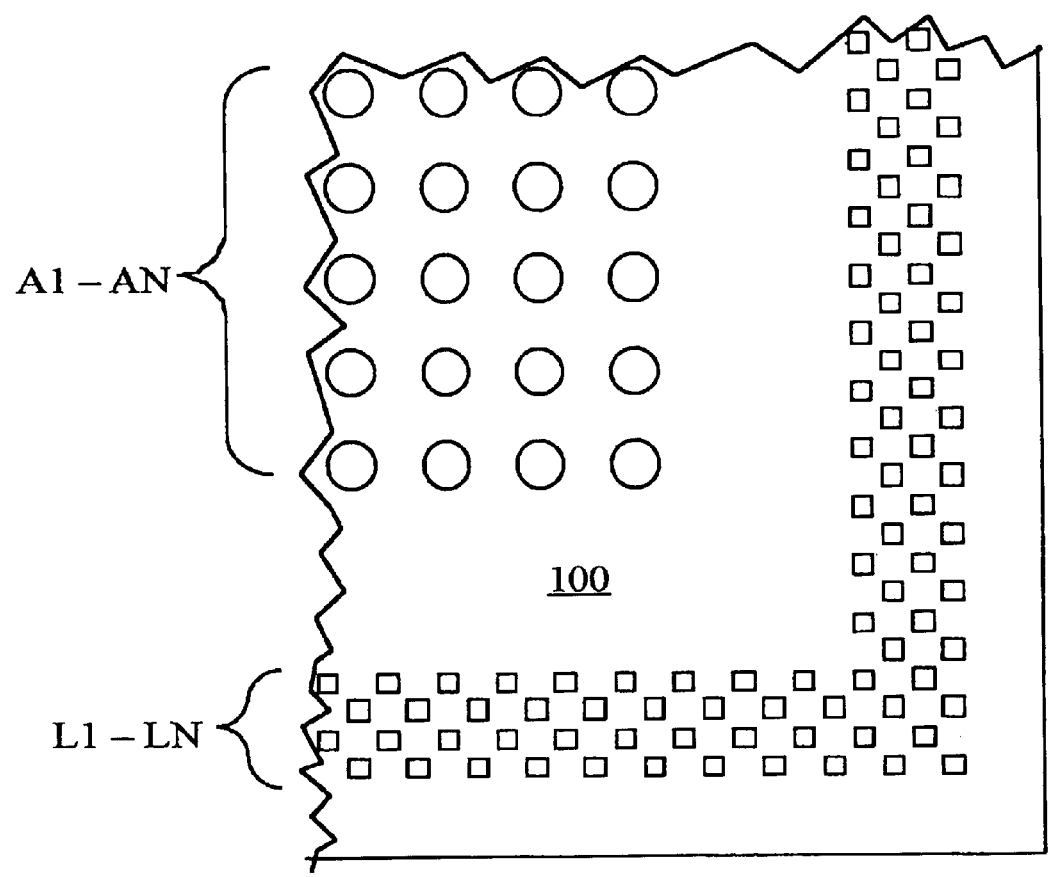
FIGS. 10B and 10A illustrate respectively, in a top plan view and an enlarged corner portion of a carrier of one specific embodiment that supports an array of 900 lands and 900 pads.
Figure 10B:
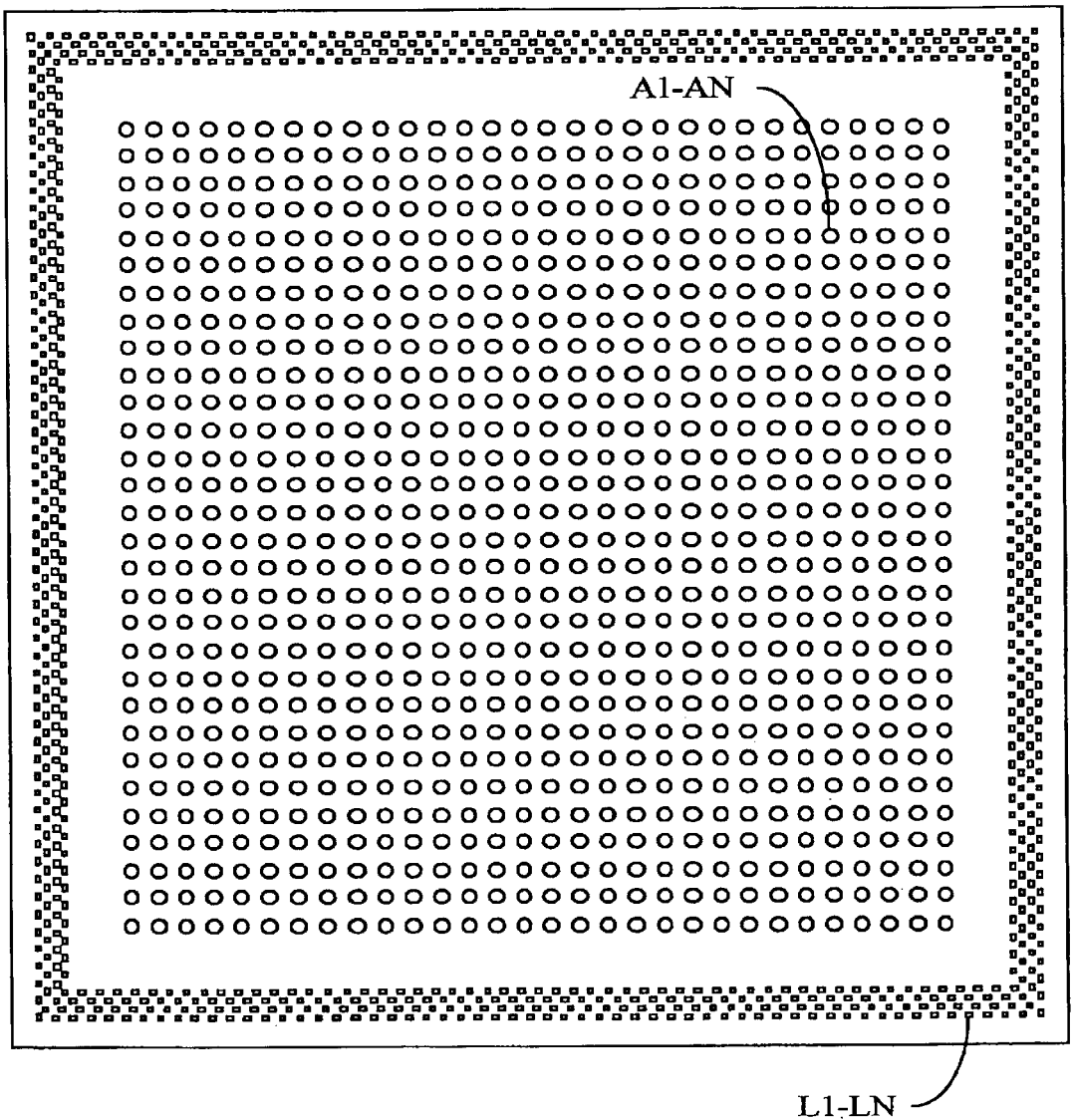
Figure 10C:
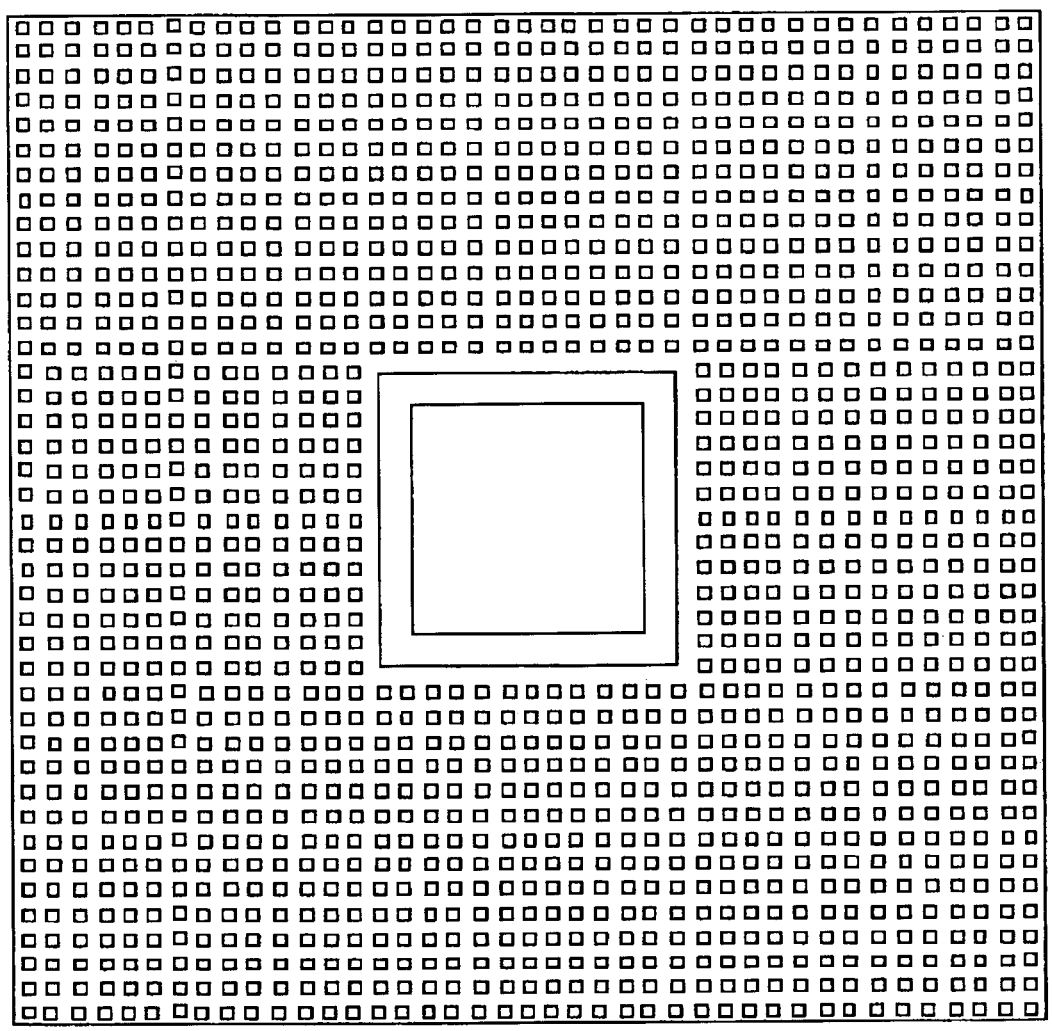
FIGS. 10C and 10D illustrate respectively, in a top plan view and a cross-sectional view respectively, the carrier of FIGS. 10A and 10B embedded in a substrate with an integrated circuit chip mounted on the carrier.
Figure 10D:

In one such embodiment, carrier 150 covers an area almost the same as (or exactly the same as) an integrated circuit chip to be mounted on carrier 150, although in other embodiments the chip can be smaller than or larger than carrier 150. For example, in one embodiment, a carrier 160 (FIG. 9A) is larger than the chip to be mounted thereon, and in this embodiment, carrier 160 includes a structure 161 of the type described above in reference to carrier 150 and further includes another layer 162 that carries lands L1–LN. In this embodiment, lands L1–LN may be more spread out and therefore at locations different from the locations of corresponding pads A1–AN. Therefore, carrier 160 eliminates the need for the corresponding terminals (not shown) of the substrate 260 to be manufactured to the same precision as terminals A1–AN. Therefore, carrier 160 may be fabricated with semiconductor processing processes whereas substrate 260 may be fabricated with printed circuit board (PCB) manufacturing processes (and in one embodiment, both these processes involve photolithography).

Numerous modifications and adaptations of the above-described embodiments will become apparent to a person skilled in the art of semiconductor physics. For example, some or all of the pads A1–AN of carrier 100 (FIG. 1A) could be directly connected to substrate 210 (FIG. 2A) by traces that are created after carrier 100i embedded into substrate 210, thereby to eliminate the need for lands L1–LN (FIG. 1A). In one such case, every even numbered pad A2, A4 etc is connected directly to the substrate 210 by traces, while the remaining odd numbered pads A1, A3 etc are connected as described above (i.e. with traces and lands of the type shown in FIG. 1A). This might be desirable because the effective pitch to make these connections would be equal to twice the pitch of the pads A1–AN, since every other pad is connected by each method, simplifying the routing paths.

Although a small number of pads and lands are illustrated in certain embodiments, a carrier to be embedded in a substrate can be scaled up to support an integrated circuit chip having any number of terminals. For example, one specific embodiment that supports an array of 900 lands and 900 pads is illustrated in FIGS. 10A–10D.

Therefore, as would be apparent from the enclosed disclosure, many embodiments of the invention do the following: (1) relieve localized stresses caused by thermal mismatch of conventional processes; and/or (2) utilize high density routing of the semiconductor industry to route dense substrates. As the ball count goes up, the complexity of the routing goes up. This is where certain embodiments provide the greatest advantage, as the high density of an embedded carrier facilitates cheaper, more efficient routing. The higher the ball or land count, the more such embodiments excel.

Also as the ball count goes up, an integrated circuit that needs to be packaged gets larger and thermal expansion mismatches are worsened in the prior art, since the coefficient of thermal expansion is multiplied by the linear dimension. Again, several embodiments of the type described herein excel at providing support as high ball count substrates for such integrated circuits. Smaller substrates are shown in all of the figures in this disclosure except FIGS. 10A–10D, primarily to illustrate the invention at a scale that can be easily seen and understood. However, many embodiments actually have significantly higher (e.g. one or more order(s) of magnitude higher) numbers of pads, solder balls etc. As an example, in the embodiment illustrated in FIGS. 10A–10D, it is difficult to show all of the lands clearly in one drawing, because of the scales needed to show large substrates.

Moreover, in some embodiments, active or passive devices may be attached to an embedded carrier of the type described herein (as may be done in a multi-chip-module) with any technique other than flip chip bonding such as wirebonding. Furthermore, although in certain embodiments, a number of solder balls are placed on the pads of chip 310 as described above, in other embodiments a number of such solder balls may be placed on pads A1–AN of carrier 100, either in addition to or instead of solder balls on chip 310.

Therefore, numerous such modifications and adaptations of the above-described embodiments are encompassed by the attached claims.

What is claimed is:

1. An electronic component comprising:
   a substrate having a top surface and a bottom surface opposite the top surface;
   a structure embedded within the substrate, the structure comprising a plurality of conductive pads facing up (hereinafter "face-up pads");

wherein the structure and the substrate are included in a monolithic integrated structure such that:
at least a portion of a bottom surface of the structure is in contact with the substrate to form an interface between the structure and the substrate; and
the structure has a top surface substantially coplanar with the top surface of the substrate;
an integrated circuit chip mounted face down on the structure, the integrated circuit chip comprising another plurality of conductive pads (hereinafter "face-down pads") opposite to the face-up pads; and
a plurality of solder joints connecting the face-up pads to the face-down pads.

2. The electronic component of claim 1 further comprising:
underfill located between the structure and the integrated circuit chip;
wherein the underfill is flexible enough to permit displacement between the structure and the integrated circuit chip due to thermal expansion.

3. The electronic component of claim 1 wherein:
the integrated circuit chip comprises a semiconductor material; and
the structure comprises said semiconductor material.

4. The electronic component of claim 1 wherein:
the integrated circuit chip comprises a first semiconductor material; and
the structure comprises a second semiconductor material.

5. The electronic component of claim 1 wherein:
in addition to said face-up pads (hereinafter "first face-up pads"), the structure comprises another plurality of conductive pads (hereinafter "second face-up pads"), and said integrated circuit chip is hereinafter "first integrated circuit chip"; and
the electronic component further comprises another integrated circuit chip (hereinafter "second integrated circuit chip") also mounted face down on said structure, the second integrated circuit chip comprising yet another plurality of conductive pads (hereinafter "second face-down pads") opposite to the second face-up pads; and
another plurality of solder joints connecting the second face-up pads to the second face-down pads.

6. The electronic component of claim 5 wherein:
the structure comprises a conductive link between one of the first face-up pads and one of the second face-up pads.

7. The electronic component of claim 5 wherein each of the first face-up pads and the second face-up pads comprise at least one of nickel and gold.

8. The electronic component of claim 1 wherein:
the integrated circuit chip is hereinafter "first integrated circuit chip"; and
the structure comprises a second integrated circuit chip.

9. The electronic component of claim 1 where the embedded structure comprises at least one active device.

10. The electronic component of claim 9 where the active device is a power transistor.

11. The electronic component of claim 1 where the embedded structure comprises at least one passive device.

12. The electronic component of claim 11 where the passive device is a capacitor.

13. The electronic component of claim 11 where the passive device is a resistor.

14. The electronic component of claim 1 where the embedded structure comprises at least one passive device and at least one active device.

15. The electronic component of claim 1 where the substrate comprises a ceramic material.

16. An electronic component comprising:
a substrate;
a structure embedded within the substrate, the structure comprising a plurality of conductive pads facing up (hereinafter "face-up pads");
an integrated circuit chip mounted face down on the structure, the integrated circuit chip comprising another plurality of conductive pads (hereinafter "face-down pads") opposite to the face-up pads; and
a plurality of solder joints connecting the face-up pads to the face-down pads;
wherein the substrate comprises a plastic including fibers selected from a group consisting of glass, fiber glass and aramid materials; and
the coefficient of thermal expansion of the structure is between the coefficient of thermal expansion of the integrated circuit chip and the coefficient of thermal expansion of the substrate.

17. The electronic component of claim 16 where the embedded structure comprises at least one active device.

18. The electronic component of claim 17 where the active device is a power transistor.

19. The electronic component of claim 16 where the embedded structure comprises at least one passive device.

20. The electronic component of claim 19 where the passive device is a capacitor.

21. The electronic component of claim 19 where the passive device is a resistor.

22. The electronic component of claim 16 where the embedded structure comprises at least one passive and at least one active device.

23. The electronic component of claim 16 where the substrate comprises a ceramic material.

24. An electronic component comprising:
a substrate having a top surface and a bottom surface opposite the top surface;
a structure embedded within the substrate, the structure comprising a plurality of conductive pads facing up (hereinafter "face-up pads");
an integrated circuit chip mounted face down on the structure, the integrated circuit chip comprising another plurality of conductive pads (hereinafter "face-down pads") opposite to the face-up pads; and
a plurality of solder joints connecting the face up pads to the face-down pads;
wherein the structure has a top surface substantially coplanar with the top surface of the substrate and the structure has a plurality of lands at a periphery thereof; and
the electronic component further comprises a lay of conductive material formed over said top surface of said structure and said top surface of said substrate, the layer being patterned to form an electrically conductive interconnect structure interconnecting the lands to another plurality of lands on the substrate.

25. The electronic component of claim 24 where the embedded structure comprises at least one active device.

26. The electronic component of claim 25 where the active device is a power transistor.

27. The electronic component of claim 24 where the embedded structure comprises at least one passive device.

28. The electronic component of claim 27 where the passive device is a capacitor.

29. The electronic component of claim 27 where the passive device is a resistor.

30. The electronic component of claim 24 where the embedded structure comprises at least one passive device and at least one active device.

31. The electronic component of claim 24 where the substrate comprises a ceramic material.

32. An electronic component comprising:
a substrate
a structure embedded within the substrate, the structure comprising a plurality of conductive pads facing up (hereinafter "face-up pads");
an integrated circuit chip mounted face down on the structure, the integrated circuit chip comprising another plurality of conductive pads (hereinafter "face-down pads") opposite to the face-up pads; and
a plurality of solder joints connecting the face-up pads to the face-down pads;
wherein the structure embedded within the substrate comprises a plurality of vias, each via being connected to one of the face-up pads.

33. The electronic component of claim 32 wherein:
the face-up pads are hereinafter "first face-up pades" and the face-down pads are hereinafter "first face down pads"; and
the structure comprises a plurality of second face-down pads arranged at locations identical to the plurality of first face-up pads, and connected thereto by the plurality of vias.

34. The electronic component of claim 32 where the embedded structure comprises at least one active device.

35. The electronic component of claim 34 where the active device is a power transistor.

36. Th electronic component of claim 32 where the embedded structure comprises at least one passive device.

37. The electronic component of claim 36 where the passive device is a capacitor.

38. The electronic component of claim 36 where the passive device is a resistor.

39. The electronic component of claim 32 where the embedded structure comprises at least one passive device and at least one active device.

40. The electronic component of claim 32 where the substrate comprises a ceramic material.

41. An electronic component comprising:
a substrate;
a structure embedded within the substrate, the structure comprising a plurality of conductive pads facing up (hereinafter "face-up pads"); "an integrated circuit chip mounted face down on the structure, the integrated circuit chip comprising another plurality of conductive pads (hereinafter "face-down pads") opposite to the face-up pads; and
a plurality of solder joints connecting the face-up pads to the face-down pads;
wherein the face-up pads are hereinafter "first face-up pads" and the face-down pads are hereinafter "first face-down pads"; and
the structure comprises a plurality of second face-down pads arranged at locations spread out from the plurality of first face-up pads.

42. The electronic component of claim 41 where the embedded structure comprises at least one active device.

43. The electronic component of claim 42 where the active device is a power transistor.

44. The electronic component of claim 41 where the embedded structure comprises at least one passive device.

45. The electronic component of claim 44 where the passive device is a capacitor.

46. The electronic component of claim 44 where the passive device is a resistor.

47. The electronic component of claim 41 where th mbedded structure comprises at least one passive device and at least one active device.

48. The electronic component of claim 41 where the substrate comprises a ceramic material.

49. A structure comprising:
a substrate comprising a plurality of lands (hereinafter "first lands"); and
a carrier embedded within the substrate, the carrier comprising another plurality of lands (hereinafter "second lands") electrically connected to the first lands, the carrier further comprising a plurality of conductive pads, the pads being arranged in a two of traces that electrically connect each of the pads to one of the second lands;
wherein:
the first lands are formed on a surface of the substrate;
the second lands are formed on a surface of the carrier, said surface of the carrier is substantially coplanar with said surface of the substrate; and
the carrier comprises a plurality of traces formed on said surfaces and connecting the first lands to the second lands.

50. The structure of claim 49 wherein:
the first lands are formed on a top surface of the substrate;
the second lands are formed on a top surface of the carrier, and the pads are also formed on said top surface of the carrier, the second lands being formed at a periphery of the carrier.

51. The structure of claim 49 wherein:
the first lands are formed on a bottom surface of the substrate;
the second lands are formed on a bottom surface of the carrier, and the second lands are arranged in a two dimensional array on said bottom surface of the carrier, the pads are formed on a top surface of the carrier, and the carrier has a plurality of vias interconnecting the second lands and the pads.

52. The structure of claim 49 further comprising:
a plurality of solder balls, each solder ball bein located on a conductive pad on the carrier embedded in the substrate.

53. The structure of claim 49 wherein:
the carrier embedded in the substrate comprises an integrated circuit chip.

54. The electronic component of claim 49 where the embedded structure comprises at least one active device.

55. The electronic component of claim 54 where the active device is a power transistor.

56. The electronic component of claim 49 where the embedded structure comprises at least one passive device.

57. The electronic component of claim 56 where the passive device is a capacitor.

58. The electronic component of claim 56 where the passive device is a resistor.

59. The electronic component of claim 49 where the embedded structure comprises at least one passive device and at least one active device.

60. The electronic component of claim 49 where the substrate comprises a ceramic material.

* * * * *